United States Patent
Nishimura et al.

(10) Patent No.: US 6,608,428 B2
(45) Date of Patent: Aug. 19, 2003

(54) LONGITUDINALLY COUPLED MULTI-MODE PIEZOELECTRIC FILTER

(75) Inventors: Toshio Nishimura, Shiga-ken (JP); Jiro Inoue, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 111 days.

(21) Appl. No.: 10/004,224

(22) Filed: Nov. 2, 2001

(65) Prior Publication Data

US 2003/0098633 A1 May 29, 2003

(30) Foreign Application Priority Data

Nov. 27, 2000 (JP) ........................................ 2000-359889

(51) Int. Cl.[7] ........................ H03H 9/54; H01L 41/083; H01L 41/107; H01L 41/047

(52) U.S. Cl. ........................ 310/366; 310/328; 333/186; 333/189

(58) Field of Search ................................ 310/328, 366; 333/186, 189

(56) References Cited

U.S. PATENT DOCUMENTS

| 5,757,106 A | * | 5/1998 | Sato et al. ........... 310/359 |
| 6,091,180 A | * | 7/2000 | Unami et al. ......... 310/328 |
| 6,466,106 B1 | * | 10/2002 | Gamo ................... 333/189 |

FOREIGN PATENT DOCUMENTS

| JP | 05-327401 | 12/1993 | ........... H03H/9/56 |

* cited by examiner

*Primary Examiner*—Thomas M. Dougherty
(74) *Attorney, Agent, or Firm*—Keating & Bennett, LLP

(57) ABSTRACT

A longitudinally coupled multi-mode piezoelectric filter is constructed to use a piezoelectric stiffened effect. The piezoelectric filter includes a multilayer piezoelectric element having at least four excitation electrodes arranged substantially parallel to one another and a plurality of piezoelectric layers which are arranged between the excitation electrodes and which are polarized in a predetermined direction. The piezoelectric filter further includes an input electrode, an output electrode, and a ground electrode. Application of an input signal between the input electrode and the ground electrode causes vibration of different order modes to be excited and coupled, such that an output signal is extracted between the output electrode and the ground electrode.

20 Claims, 16 Drawing Sheets

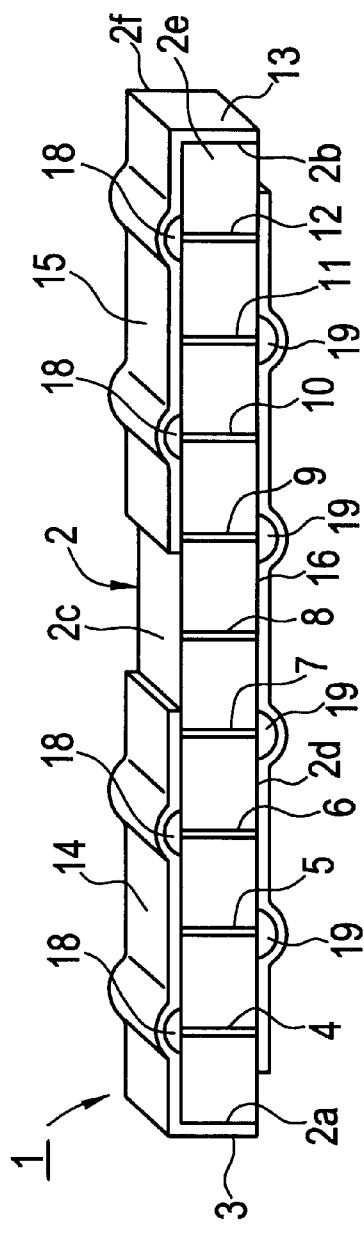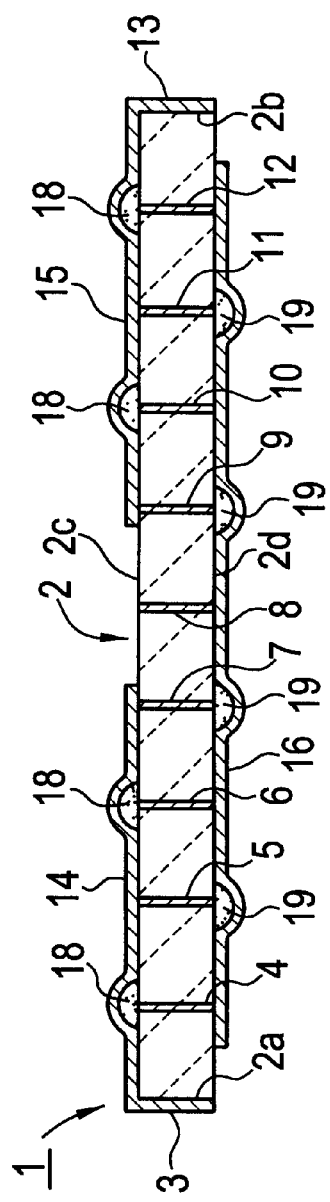

LONGITUDINALLY COUPLED MULTI-MODE PIEZOELECTRIC FILTER

BACKGROUND OF THE INVENTION

1. Field of the Invention

The present invention relates to piezoelectric filters used for bandpass filters, and more specifically to a longitudinally coupled multi-mode piezoelectric filter that has a piezoelectric stiffened effect and uses coupling of different order modes.

2. Description of the Related Art

Conventionally, various piezoelectric filters have been used as bandpass filters. In a frequency range of between several MHz and several tens of MHz, dual-mode piezoelectric filters, which are small and inexpensive, are commonly used.

A dual-mode piezoelectric filter of this type is disclosed in, for example, Japanese Unexamined Patent Application Publication No. 5-327401.

FIG. 20 is a sectional view of a conventional dual-mode piezoelectric filter that uses thickness extensional vibration.

A piezoelectric filter 201 includes a piezoelectric plate 202 that is polarized in the thickness direction. A pair of excitation electrodes 203 and 204 is provided on the upper surface of the piezoelectric plate 202, and a common excitation electrode 205 is provided on the lower surface of the piezoelectric plate 202 so as to oppose the excitation electrodes 203 and 204 via the piezoelectric plate 202.

In operation, an input voltage is applied between the excitation electrode 203 and the common excitation electrode 205 to excite the piezoelectric plate 202. This results in a symmetric mode shown in FIG. 21A and an asymmetric mode shown in FIG. 21B, both of which are coupled to define a filter band. The output is extracted between the excitation electrode 204 and the ground electrode 205.

Besides the dual-mode piezoelectric filter using the thickness extensional mode as described above, there is also a known dual-mode piezoelectric filter in which the piezoelectric plate 202 is polarized in the direction parallel to the upper surface thereof such that thickness shear vibration is utilized.

In the conventional piezoelectric filter 201, the coupling strength between the symmetric mode and the asymmetric mode is dependent upon the spacing between the excitation electrodes 203 and 204. Thus, the distance of between the excitation electrodes 203 and 204 determines the frequency difference between the symmetric mode and the asymmetric mode, thereby determining the passband.

Thus, to provide a filter having a wider band, the spacing must be reduced, and the coupling and the frequency difference between the excitation electrodes 203 and 204 must be increased.

The excitation electrodes 203 and 204 are typically formed of conductive paste using a screen-printing method. In screen-printing, however, the ability to minimize the spacing therebetween is limited. On the other hand, forming the excitation electrodes 203 and 204 by photolithography can reduce the spacing therebetween. This, however, leads to greatly increased cost.

There is also a problem with this arrangement in that an increased electrostatic capacity and decreased attenuation occur between the input and the output of the piezoelectric filter 201, even when the spacing between the excitation electrodes 203 and 204 is reduced.

SUMMARY OF THE INVENTION

To overcome the above-described problems, preferred embodiments of the present invention provide a longitudinally coupled multi-mode piezoelectric filter that achieves a wider band, greater out-of-band attenuation, and lower fabrication cost.

According to a first preferred embodiment of the present invention, a longitudinally coupled multi-mode piezoelectric filter is provided that utilizes piezoelectric stiffened effect. The longitudinally coupled multi-mode piezoelectric filter includes a multilayer piezoelectric element. The multilayer piezoelectric element has at least four excitation electrodes arranged substantially parallel to one another, and a plurality of piezoelectric layers each provided between two adjacent excitation electrodes and polarized in the direction that is substantially perpendicular to or substantially parallel to the excitation electrodes. The multilayer piezoelectric element has first and second end surfaces opposing each other in the direction that is substantially perpendicular to the excitation electrodes. The piezoelectric filter further includes a ground electrode, an input electrode, and an output electrode. The ground electrode is provided on the outer surface of the multilayer piezoelectric element and is electrically connected to a first group including at least two of the excitation electrodes, the at least two of the excitation electrodes being selectively arranged in the direction in which the piezoelectric layers are provided. The input electrode is provided on the outer surface of the multilayer piezoelectric element and is electrically connected to a second group including at least one of the excitation electrodes, the at least one of the excitation electrodes being arranged toward the first end surface and defined by excitation electrodes other than the excitation electrodes of the first group. The output electrode is provided on the outer surface of the multilayer piezoelectric element and is electrically connected to a third group including at least one of the excitation electrodes, the at least one of the excitation electrodes being disposed near the second end surface and being defined by excitation electrodes other than the excitation electrodes of the first group. Application of an input signal between the input electrode and the ground electrode causes vibration of different order modes to be excited and coupled, such that an output signal is extracted between the output electrode and the ground electrode.

According to the first preferred embodiment of the present invention, adjustment of the number of the piezoelectric layers enables the use of various different order modes, thereby producing a wider band filter characteristic.

On the other hand, in the conventional dual-mode piezoelectric filter, the spacing between the excitation electrodes provided on one surface of the piezoelectric plate determines the frequency difference of each mode, thus requiring increased accuracy when forming the excitation electrodes to produce a wider bandwidth. In contrast, according to various preferred embodiments of the present invention, a wider band is easily produced by simply selecting modes to be utilized.

Furthermore, in the conventional dual-mode piezoelectric filter, a reduction in spacing between the excitation electrodes provided on one surface of the piezoelectric plate to achieve a wider band causes an increase in the electrostatic capacity between the input and output, thereby reducing the attenuation. However, the multi-mode piezoelectric filters according to preferred embodiments of the present invention achieve a wider band without reducing the spacing between the excitation electrodes, thus producing a greatly increased attenuation.

Accordingly, a longitudinally coupled multi-mode piezoelectric filter having a wider band and greater attenuation is produced at a greatly reduced cost in preferred embodiments of the present invention.

In various preferred embodiments of the present invention, an nth harmonic and an (n−1)th harmonic are used as the different order modes to produce a dual-mode piezoelectric filter according to preferred embodiments of the present invention. Alternatively, an nth harmonic, an (n−1)th harmonic, and an (n+1)th harmonic are used as the different order modes to produce a triple-mode piezoelectric filter according to preferred embodiments of the present invention, thereby producing an even wider band.

According to a second preferred embodiment of the present invention, a longitudinally coupled multi-mode piezoelectric filter utilizes piezoelectric stiffened effect. The longitudinally coupled multi-mode piezoelectric filter includes a multilayer piezoelectric element. The multilayer piezoelectric element includes at least four excitation electrodes arranged substantially parallel to one another, and a plurality of piezoelectric layers each provided between two adjacent excitation electrodes and polarized in the direction that is substantially perpendicular to the excitation electrodes. The multilayer piezoelectric element has first and second end surfaces opposing each other in the direction that is substantially perpendicular to the excitation electrodes, and has first, second, third, and fourth side surfaces extending between the first and second end surfaces. The direction in which the side surfaces extend defines the longitudinal direction of the piezoelectric element. The longitudinally coupled multi-mode piezoelectric filter also includes a ground electrode, an input electrode, and an output electrode. The ground electrode is provided on the outer surface of the multilayer piezoelectric element and is electrically connected to a first group including at least two of the excitation electrodes, the at least two of the excitation electrodes being selectively arranged in the direction in which the piezoelectric layers are provided. The input electrode is provided on the outer surface of the multilayer piezoelectric element and is electrically connected to a second group including at least one of the excitation electrodes, the at least one of the excitation electrodes being arranged toward the first end surface and defined by excitation electrodes other than the excitation electrodes of the first group. The output electrode is provided on the outer surface of the multilayer piezoelectric element and is electrically connected to a third group including at least one of the excitation electrodes, the at least one of the excitation electrodes being disposed near the second end surface and defined by excitation electrodes other than the excitation electrodes of the first group. Application of input signal between the input electrode and the ground electrode causes excitation and coupling of vibration of different order longitudinal modes, such that an output signal is extracted between the output electrode and the ground electrode.

The longitudinally coupled multi-mode piezoelectric filter according to the second preferred embodiment produces a wider band and greater attenuation.

According to a third preferred embodiment of the present invention, a longitudinally coupled multi-mode piezoelectric filter utilizes piezoelectric stiffened effect. The longitudinally coupled multi-mode piezoelectric filter includes a multilayer piezoelectric element. The multilayer piezoelectric element includes at least four excitation electrodes arranged substantially parallel to one another, and a plurality of piezoelectric layers each provided between two adjacent excitation electrodes and polarized in the direction that is substantially perpendicular to the excitation electrodes. The multilayer piezoelectric element includes first and second end surfaces opposing each other in the direction that is substantially perpendicular to the excitation electrodes, and has first, second, third, and fourth side surfaces extending between the first and second end surfaces. The direction in which the side surfaces extend is the thickness direction of the piezoelectric element. The longitudinally coupled multi-mode piezoelectric filter also includes a ground electrode, an input electrode, and an output electrode. The ground electrode is provided on the outer surface of the multilayer piezoelectric element and is electrically connected to a first group including at least two of the excitation electrodes, the at least two of the excitation electrodes being selectively arranged in the direction in which the piezoelectric layers are provided. The input electrode is provided on the outer surface of the multilayer piezoelectric element and is electrically connected to a second group including at least one of the excitation electrodes, the at least one of the excitation electrodes being disposed near the first end surface and defined by excitation electrodes other than the excitation electrodes of the first group. The output electrode is provided on the outer surface of the multilayer piezoelectric element and is electrically connected to a third group including at least one of the excitation electrodes, the at least one of the excitation electrodes being disposed near the second end surface and defined by excitation electrodes other than the excitation electrodes belonging to the first group. Application of an input signal between the input electrode and the ground electrode causes excitation and coupling of vibration of different order thickness extensional modes, such that an output signal is extracted between the output electrode and the ground electrode.

The longitudinally coupled multi-mode piezoelectric filter according to the third preferred embodiment of the present invention also achieves a wider band and greater attenuation as in the first preferred embodiment of the present invention. Therefore, a piezoelectric filter that utilizes harmonics of a thickness extensional mode of vibration and achieves superior filter characteristics is produced.

According to a fourth preferred embodiment of the present invention, a longitudinally coupled multi-mode piezoelectric filter includes a multilayer piezoelectric element. The multilayer piezoelectric element includes at least four excitation electrodes arranged substantially parallel to one another, and a plurality of piezoelectric layers each provided between two adjacent excitation electrodes and polarized in the direction that is substantially parallel to the excitation electrodes. The multilayer piezoelectric element has first and second end surfaces opposing each other in the direction that is substantially perpendicular to the excitation electrodes, and has first, second, third, and fourth side surfaces extending between the first and second end surfaces. The direction in which the side surfaces extend is the thickness direction of the piezoelectric element. The longitudinally coupled multi-mode piezoelectric filter includes a ground electrode, an input electrode, and an output electrode. The ground electrode is provided on the outer surface of the multilayer piezoelectric element and is electrically connected to a first group including at least two of the excitation electrodes, the at least two of the excitation electrodes being selectively arranged in the direction in which the piezoelectric layers are provided. The input electrode is provided on the outer surface of the multilayer piezoelectric element and is electrically connected to a second group including at least one of the excitation electrodes, the at least one of the excitation electrodes being arranged toward the first end surface and defined by excitation electrodes other than the excitation electrodes of the first group. The output electrode is provided on the outer surface of the multilayer piezoelectric element and is electrically connected to a third group including at least one of the excitation electrodes, the at least one of the excitation electrodes being arranged toward the second end surface and defined by excitation electrodes other than the excitation electrodes of the first group. Application of an input signal between the input electrode and the ground electrode causes excitation and coupling of vibration of different order thickness shear modes, such that an output signal is extracted between the output electrode and the ground electrode.

The longitudinally coupled multi-mode piezoelectric filter according to the fourth preferred embodiment of the present invention also achieves a wider band and greater attenuation as in the first, second and third preferred embodiments of the present invention. Therefore, a longitudinally coupled multi-mode piezoelectric filter that utilizes harmonics of a thickness shear mode of vibration and which has superior filter characteristics is produced.

Preferably, the different order modes are an nth harmonic and an (n−1)th harmonic, where n is an integer equal to or greater than 3.

Alternatively, the different order modes are preferably an nth harmonic, an (n−1)th harmonic, and an (n+1)th harmonic, where n is an integer equal to or greater than 3. This arrangement produces an even wider band.

Preferably, at least one of the first group of the excitation electrodes is arranged between an excitation electrodes of the second group and an excitation electrode of the third group.

This arrangement greatly reduces electrostatic capacity between the input and output, thereby producing even greater attenuation.

A longitudinally coupled multi-mode piezoelectric filter according to various preferred embodiments of the present invention further includes reflection layers and holding portions. The reflection layers are respectively coupled to the first and second end surfaces of the multilayer piezoelectric element and are preferably made of material having a second acoustic impedance $Z_2$ that is smaller than the acoustic impedance $Z_1$ of piezoelectric material defining the piezoelectric layers of the multilayer piezoelectric element. The holding portions are respectively coupled to outer surfaces of the reflection layers and are preferably made of material having a third acoustic impedance $Z_3$ that is greater than the second acoustic impedance $Z_2$, the outer surfaces of the reflection layers oppose the first and second end surfaces to which the reflection layers are coupled.

In this case, vibration that has propagated from the multilayer piezoelectric element is reflected at the interfaces between the reflection layers and the holding portions. The holding portions, therefore, are used to mechanically hold the piezoelectric filter without affecting the characteristics thereof.

Other features, elements, characteristics, and advantages of the present invention will become more apparent from the following detailed description of preferred embodiments of the present invention with reference to the attached drawings.

BRIEF DESCRIPTION OF THE DRAWINGS

FIGS. 1A and 1B are a perspective view and a longitudinal sectional view, respectively, illustrating a multi-mode piezoelectric filter according to a first preferred embodiment of the present invention.

DETAILED DESCRIPTION OF PREFERRED EMBODIMENTS

Figure 2A:
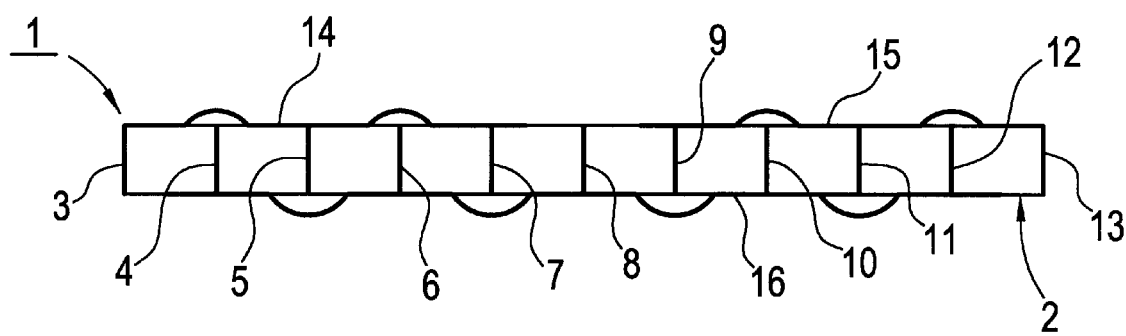
FIG. 2A is a front view schematically illustrating the multi-mode piezoelectric filter of the first preferred embodiment.

The present invention will become more apparent from the following description of preferred embodiments thereof with reference to the appended drawings.

FIGS. 1A and 1B are a perspective view and a longitudinal sectional view, respectively, illustrating a longitudinally coupled dual-mode piezoelectric filter according to a first preferred embodiment of the present invention.

A piezoelectric filter 1 preferably includes a piezoelectric element 2 in the form of a substantially rectangular bar with a substantially square cross section. The piezoelectric filter 1 is preferably a dual-mode piezoelectric filter utilizing a longitudinal mode in which vibration propagates in the longitudinal direction of the piezoelectric element 2.

In the present invention, the piezoelectric element 2 is made of, for example, lead zirconate titanate piezoelectric ceramic, or other suitable material.

The piezoelectric element 2 has a first end surface 2a and a second end surface 2b that oppose each other in the longitudinal direction. An excitation electrode 3 is provided to cover the end surface 2a. A plurality of excitation electrodes 4 to 12, each extending in a cross-sectional direction, is also provided with spaces therebetween in the longitudinal direction. Further, an excitation electrode 13 is provided to cover the end surface 2b.

Thus, the excitation electrodes 3 to 13 are arranged substantially parallel to one another, and piezoelectric layers are provided between each of the excitation electrodes 3 to 13.

In the piezoelectric element 2, the piezoelectric layers at both sides of the excitation electrodes are polarized in a direction that is substantially perpendicular to the excitation electrodes 3 to 13.

The excitation electrodes 3 to 13 are preferably made of the piezoelectric ceramic, which defines the piezoelectric element 2, by a co-firing technique. However, the piezoelectric element 2 and the excitation electrodes 3 to 13 may be formed by an alternative method, and the formation of excitation electrodes 3 and 13 at the end surfaces 2a and 2b, respectively, may also be performed after the piezoelectric element 2 is provided by a co-firing technique.

The piezoelectric element 2 has an upper surface 2c, a lower surface 2d, and a pair of side surfaces 2e and 2f, which extend between the end surfaces 2a and 2b. On the upper surface 2c, an input electrode 14 is provided toward the end surface 2a, and an output electrode 15 is provided toward the end surface 2b. On the lower surface 2d, a ground electrode 16 is provided.

The input electrode 14, the output electrode 15, and the ground electrode 16 are formed of an appropriate metallic material, such as copper, nickel, silver, or other suitable metallic material, similar to that of the excitation electrodes 3 to 13.

An insulating material 18 is provided on the upper ends of the excitation electrodes 4, 6, 10, and 12 to provide electrical insulation between the input electrode 14 and the excitation electrodes 4 and 6, and to provide electrical isolation between the output electrode 15 and the excitation electrodes 10 and 12. The excitation electrodes 4, 6, 8, 10, and 12 are electrically connected to the ground electrode 16.

On the other hand, the lower ends of the excitation electrodes 5, 7, 9, and 11 are provided with an insulating material 19 that provides electrical insulation between the ground electrode 16 and the excitation electrodes 5, 7, 9, and 11. The excitation electrodes 3 and 13, which are provided at the end surfaces 2a and 2b, respectively, are connected to the input electrode 14 and the output electrode 15, respectively.

For ease of description, the excitation electrodes 3 to 13 are classified into groups. That is, a plurality of the excitation electrodes 4, 6, 8, 10, and 12, which is selectively arranged in the stacked direction of the excitation electrodes 3 to 13, is defined as a first group. Of the remaining excitation electrodes 3, 5, 7, 9, 11, and 13, a plurality of the excitation electrodes 3, 5, and 7, which is arranged toward the first end surface 2b, is defined as a second group. A plurality of the excitation electrodes 9, 11, and 13, which is arranged toward the second surface 2b, is defined as a third group. Electrical connection of these groups with the input electrode 14, the output electrode 15, and the ground electrode 16 will be described below.

The first group including the excitation electrodes 4, 6, 8, 10, and 12 is electrically connected to the ground electrode 16. The second group including the excitation electrodes 3, 5, and 7 is connected to the input electrode 14. The third group including the excitation electrodes 9, 11, and 13 is connected to the output electrode 15.

In this preferred embodiment, the excitation electrodes 3 to 13 are arranged to cover the entire cross sections of the piezoelectric element 2. However, the cross sections may be only partially covered.

Moreover, with respect to the materials that define the insulating materials 18 and 19, for example, an insulating resin or insulating adhesion can be used, but is not limited thereto, and other suitable materials may be used.

The operation of the multi-mode piezoelectric filter 1 according to the preferred embodiment will now be described with reference to FIGS. 2A to 2C.

Figure 2B:
FIGS. 2B and 2C are schematic diagrams illustrating a tenth harmonic and a ninth harmonic, respectively.
Figure 2C:
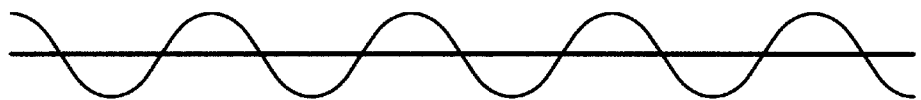

FIG. 2A is a front view schematically illustrating the structure of electrodes of the piezoelectric filter 1. Application of an input voltage between the input electrode 14 and the ground electrode 16 causes the piezoelectric element 2 to be excited by a piezoelectric effect. This results in intense excitation of a tenth harmonic of the longitudinal mode, schematically shown in FIG. 2B, and a ninth harmonic of the longitudinal mode, schematically shown in FIG. 2C. These modes are coupled to define a passband, thereby extracting an output from the output electrode 15. This process will now be described in accordance with a specific experimental example.

An example of the piezoelectric filter 1 was fabricated such that the piezoelectric element 2 had a height of about 100 µm and a width of about 220 µm, and such that each piezoelectric layer sandwiched between the adjacent excitation electrodes had a thickness (the longitudinal direction of the piezoelectric element 2) of about 130 µm. The piezoelectric element 2 was thus fabricated to have a total thickness of about 1,300 µm, excluding the thickness of the electrodes. The impedance characteristics and filter characteristics of this arrangement were then measured; the results of which are shown in FIGS. 4 and 5.

Figure 4:
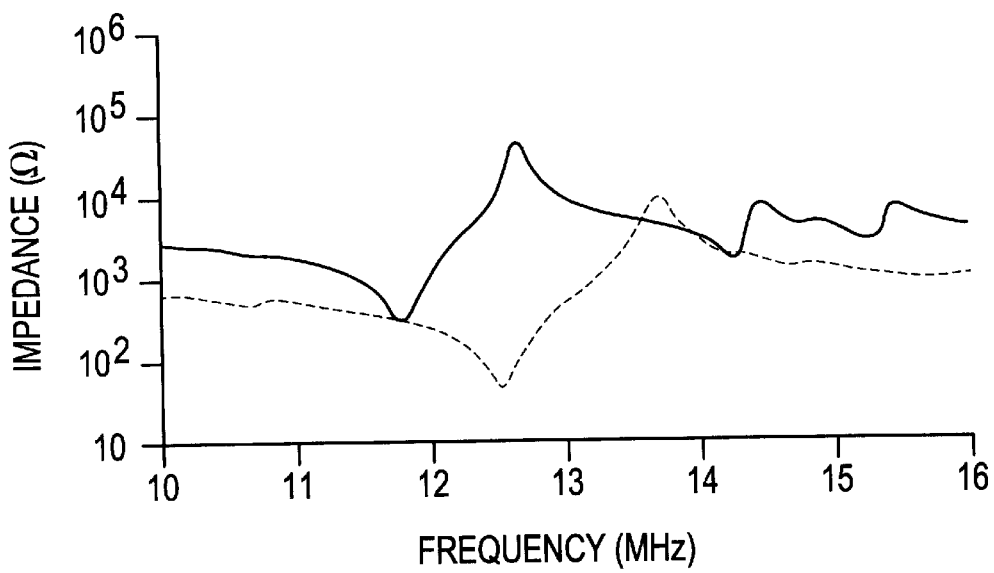
FIG. 4 is a graph showing impedance characteristics of the multi-mode piezoelectric filter of the first preferred embodiment of the present invention.

FIG. 4 is a graph showing the impedance characteristics of the ninth harmonic and tenth harmonic that were excited. The solid line indicates the characteristic of the ninth harmonic and the broken line indicates the characteristic of the tenth harmonic. As shown in FIG. 4, responses of the ninth harmonic and the tenth harmonic are adjacent to each other. This, therefore, shows that the arrangement provides a filter characteristic wherein the resonant frequency of the ninth harmonic and the anti-resonant frequency of the tenth harmonic are the attenuation poles.

Figure 5:
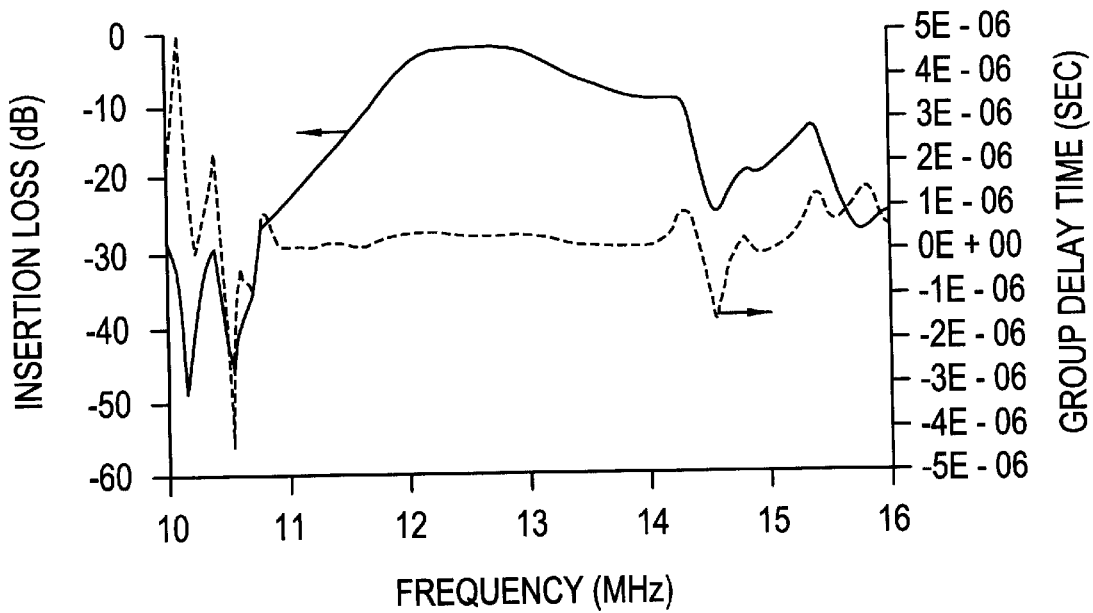
FIG. 5 is a graph showing filter characteristics of the multi-mode piezoelectric filter of the first preferred embodiment of the present invention.

FIG. 5 is a graph showing the attenuation-frequency characteristic and group delay time characteristic of the piezoelectric element. In FIG. 5, the solid line indicates the attenuation-frequency characteristic, and the broken line indicates the group delay time characteristic. The iE-0j of the right scale in FIG. 5 indicates $i \times 10^{-j}$. As shown in FIG. 5, the arrangement according to this preferred embodiment provides filter characteristics having a center frequency of about 12.5 MHz and a bandwidth of about 1.3 MHz.

Figure 20:
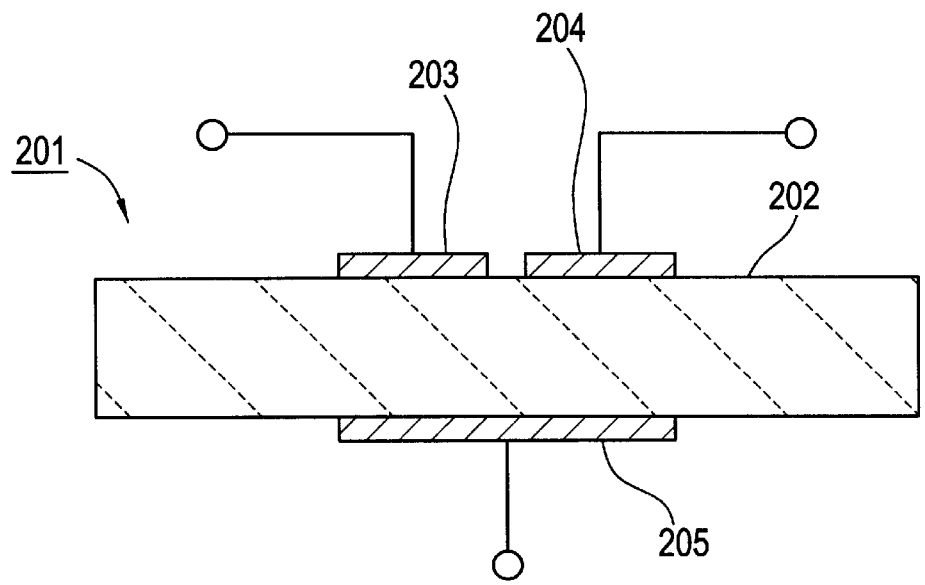
FIG. 20 is a sectional view illustrating a dual-mode piezoelectric filter that utilizes a conventional thickness extensional mode of vibration.
Figure 21A:
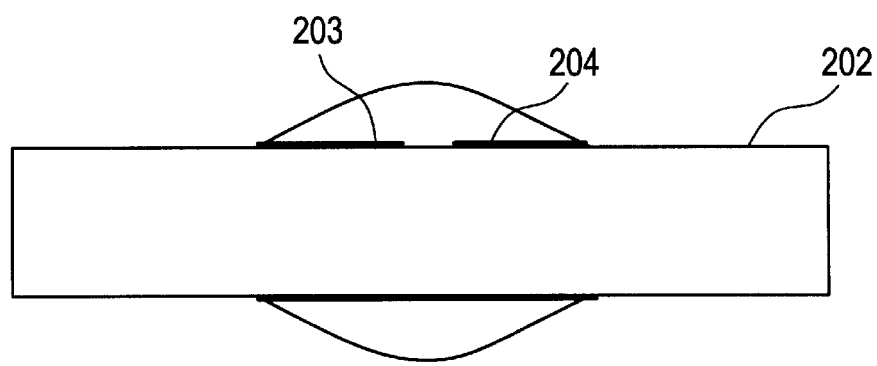
FIGS. 21A and 21B are schematic diagram illustrating, respectively, a symmetric mode and an asymmetric mode that are excited in the conventional dual-mode piezoelectric filter shown in FIG. 20.
Figure 21B:
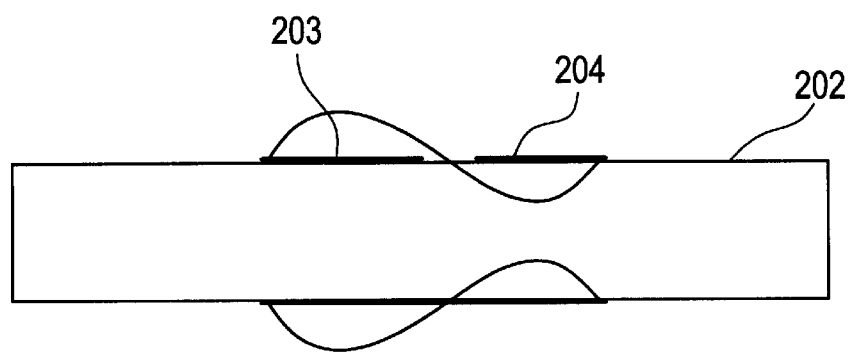

In the conventional dual-mode piezoelectric filter 201 (see FIG. 20), the frequency difference between the symmetric and asymmetric modes is dependent upon the spacing between the excitation electrodes 203 and 204 provided on one surface of the piezoelectric plate 202. By contrast, in the piezoelectric filter 1 of this preferred embodiment, the frequency difference between the ninth harmonic and the tenth harmonic is determined by the ratio of the orders of harmonics and is independent of the spacing between the excitation electrodes. Thus, the use of the ninth harmonic and tenth harmonic provides a passband with a frequency determined by the ratio of the order of the ninth harmonic to the order of the tenth harmonic. Accordingly, by selecting harmonics in accordance with a desired bandwidth, the desired bandwidth is achieved.

In this preferred embodiment, ten piezoelectric layers are provided between the excitation electrodes 3 to 13, such that the ninth harmonic and the tenth harmonic are efficiently excited. However, changing the number of the piezoelectric layers to 11 allows the use of an 11th harmonic and a tenth harmonic to define the dual-mode piezoelectric filter, thereby facilitating adjustment of the bandwidth.

In other words, an nth harmonic and an (n–1)th harmonic (n is an integer equal to 3 or greater) is utilized to define the dual-mode piezoelectric filter. Selecting the n facilitates providing various bandwidths for the piezoelectric filter. Thus, to provide a wider band, two modes with a greater difference in orders are used.

That is, the conventional dual-mode piezoelectric filter requires that the excitation electrodes 203 and 204 be formed more accurately in order to provide a wider band. In contrast, the piezoelectric filter 1 of this preferred embodiment facilitates the achievement of a desired or wider band, without significantly increasing the accuracy with which the excitation electrodes 3 to 13 must be formed.

In the piezoelectric filter 1, the attenuation is dependent on the ratio of electrostatic capacity $C_{I-G}$ to $C_{I-O}$, wherein $C_{I-G}$ is a value between the input electrode 14 and the ground electrode 16, and $C_{I-O}$ is a value between the input electrode 14 and the output electrode 15. Thus, the larger $C_{I-G}/C_{I-O}$ is or the smaller $C_{I-O}$ is, the greater the attenuation becomes. In this preferred embodiment, the excitation electrode 8 that is connected to the ground potential is provided between the excitation electrodes 3, 5, and 7, electrically connected to the input electrode 14, and the excitation electrodes 9, 11, and 13, and electrically connected to the output electrode 15. That is, the excitation electrode 8 of the first group is provided between the closest excitation electrodes 7 and 9, the excitation electrode 7 belonging to the first group and the excitation electrode 9 belonging to the second group. As a result, the arrangement of this preferred embodiment provides a smaller $C_{I-O}$, thus allowing for increased out-of-band attenuation. The piezoelectric filter 1, therefore, provides greater attenuation than the conventional piezoelectric filter 201.

In this preferred embodiment, all of the piezoelectric layers between the excitation electrodes 3 to 13 preferably have the same thickness; however, the thicknesses thereof may be different. Thus, changing the thickness optionally can enhance the excitation efficiencies of harmonics of interest and can also decrease the excitation efficiencies of the spurious harmonics.

The piezoelectric filter 1 of this preferred embodiment vibrates in its entirety, and thus needs to be mechanically supported with a spring terminal or other suitable mechanical support. Thus, as a modification shown in FIG. 3, reflection layers 21 and 22 and holding portions 23 and 24 are respectively coupled to end surfaces of the multilayer piezoelectric element 2 of the piezoelectric filter 1, such that the holding portions 23 and 24 mechanically hold the piezoelectric filter 1. In the arrangement shown in FIG. 3, the reflection layers 21 and 22 are made of material having a second acoustic impedance $Z_2$ that is smaller than the acoustic impedance $Z_1$ of the piezoelectric element 2. The holding portions 23 and 24 have a third acoustic impedance $Z_3$ that is greater than the second acoustic impedance $Z_2$. Thus vibration that propagates from the piezoelectric element 2 is reflected, as will be described below, at the interfaces between the reflection layers 21 and 22 and the holding portions 23 and 24. It is thus possible to minimize vibration that leaks into the holding portions 23 and 24. As a result, even if the holding portions 23 and 24 are used to provide the mechanical support, the filter characteristics of the piezoelectric filter 1 are not affected.

Figure 3:
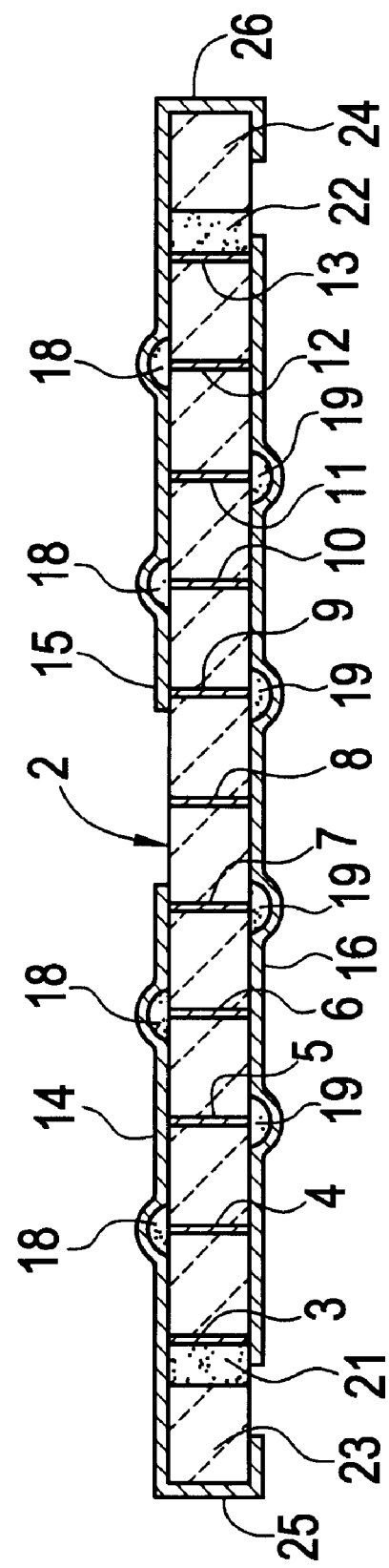
FIG. 3 is a longitudinal sectional view illustrating a modification of the multi-mode piezoelectric filter of the first preferred embodiment of the present invention.

Accordingly, as the modification shown in FIG. 3, the reflection layers 21 and 22 and the holding portions 23 and 24 are preferably coupled to both end surfaces of the piezoelectric filter, respectively.

Figure 19:
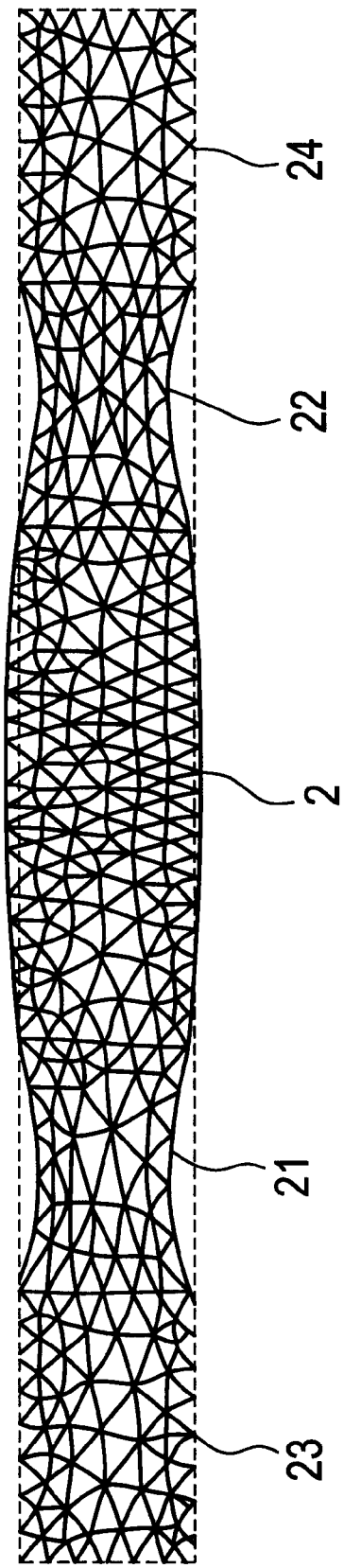
FIG. 19 shows an analysis result of displacement distribution, using a finite element method, of a piezoelectric filter having reflection layers and holding portions.

FIG. 19 shows an analysis result of the displacement distribution by a finite-element method, during operation of the piezoelectric filter 1 with the reflection layers 21 and 22 and the holding portions 23 and 24.

As shown in FIG. 19, almost no vibration from the piezoelectric filter 1 propagates to the holding portions 23 and 24. As a result, even if the holding portions 23 and 24 are utilized to provide the mechanical support, this no real effect on filter characteristics of the piezoelectric filter 1. In order to further ensure the reflection of vibration, which has propagated, at the interfaces between the reflection layers 21 and 22 and the holding portions 23 and 24, each of the reflection layers 21 and 22 preferably has a thickness in the range of $(m\gamma/4) \pm (\gamma/8)$, where $\gamma$ is a wavelength of vibration that has propagated and m is an odd number.

The reflection layers 21 and 22 and the holding portions 23 and 24 may be formed of any material that satisfies the above-noted impedance relationship. For example, the reflection layers 21 and 22 can be formed of an epoxy resin or a composite of an epoxy resin and a filler. The holding portions 23 and 24 can be made of a piezoelectric ceramic similar to that of the piezoelectric element 2 or other suitable insulating ceramic.

In the modification shown in FIG. 3, terminal electrodes 25 and 26 are provided to facilitate surface mounting. Specifically, the terminal electrodes 25 and 26 are provided to extend to the holding portions 23 and 24 and the reflection layers 21 and 22, and to further extend to the lower surfaces via the outer end surfaces of the holding portions 23 and 24, respectively.

Figure 6:
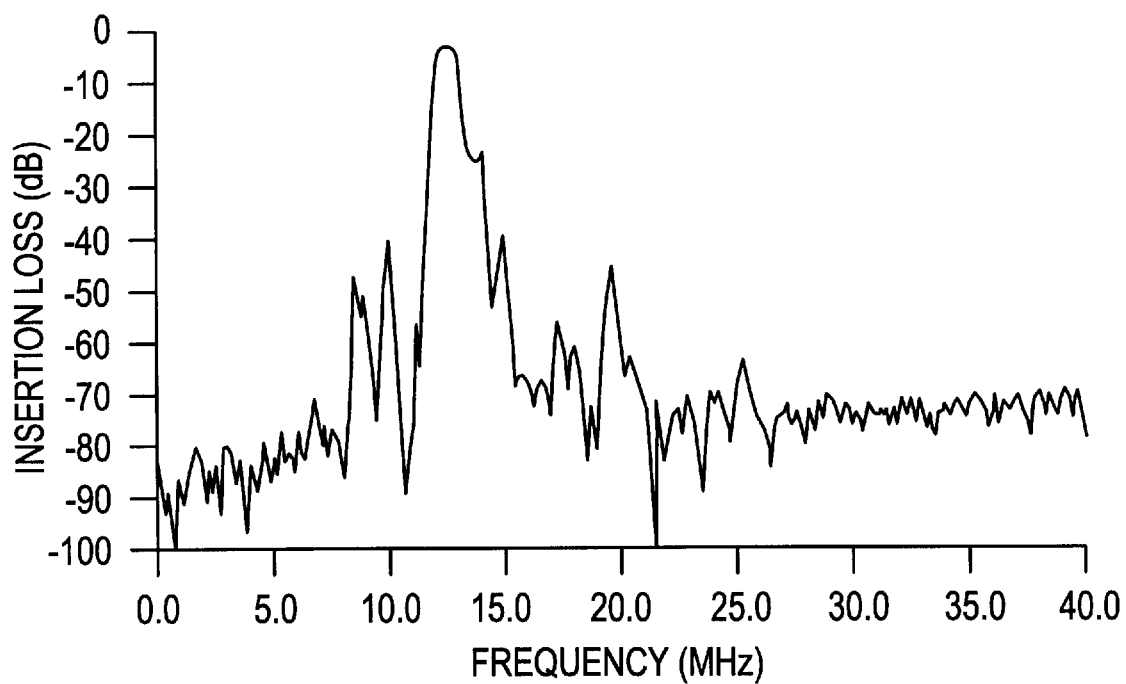
FIG. 6 is a graph showing a filter characteristic of a structure in which a pair of the multi-mode piezoelectric filters according to the first preferred embodiment of the present invention is interconnected.

When two of the piezoelectric filters are used and the reflection layers 21 and 22 and the holding portions 23 and 24 thereof are coupled, the pair of piezoelectric filters 1 are interconnected using the holding portions 23 and 24 to provide a two-element type piezoelectric filter. A filter characteristic of an exemplary two-element type piezoelectric filter thus connected is shown in FIG. 6.

Figure 7:
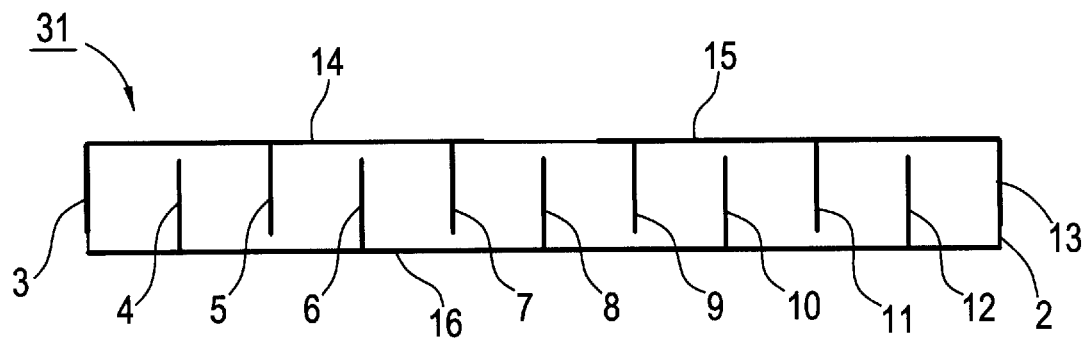
FIG. 7 is a front view schematically illustrating another modification of the multi-mode piezoelectric filter of the first preferred embodiment of the present invention.

FIG. 7 is a front view schematically illustrating another modification of the piezoelectric filter 1 according to the first preferred embodiment. In the piezoelectric filter 1 of the first preferred embodiment, the insulating materials 18 and 19 provide electrical insulation between the excitation electrodes and the electrodes that must be electrically isolated from the excitation electrodes. In contrast, as shown in FIG. 7, the excitation electrodes of this modification are arranged such that they are not in contact with either the upper surface or lower surface, whereby the electrical isolation is achieved between the excitation electrodes and the electrodes that must be insulated from the excitation electrodes.

In a piezoelectric filter 31 of the modification shown in FIG. 7, the excitation electrodes 3, 5, 7, 9, 11, and 13 are arranged so as not to extend to the lower surface of the piezoelectric element 2. This electrically isolates the excitation electrodes 3, 5, 7, 9, 11, and 13 of the second and third groups from the ground electrode 16. Similarly, the excitation electrodes 4, 6, 8, 10, and 12 are arranged so as not to extend to the upper surface of the piezoelectric element 2. This electrically isolates the excitation electrodes 4, 6, 8, 10, and 12 from the input electrode 14 and the output electrode 15.

Figure 8:
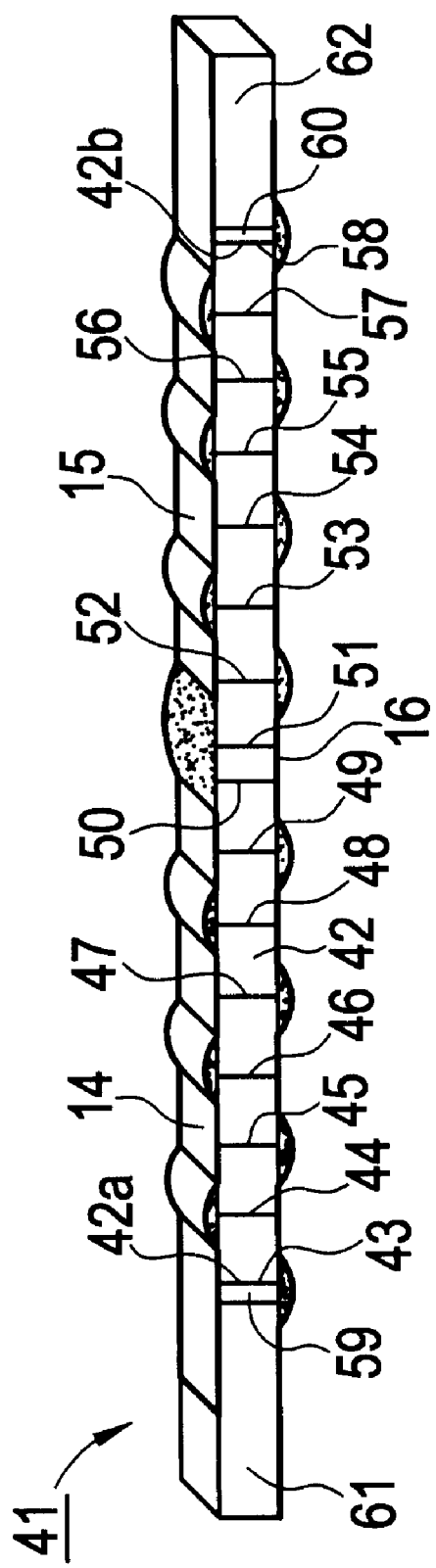
FIG. 8 is a perspective view illustrating a multi-mode piezoelectric filter according to a second preferred embodiment of the present invention.

FIG. 8 is a perspective view illustrating a piezoelectric filter 41 according to a second preferred embodiment of the present invention. The piezoelectric filter 41 of this preferred embodiment is a longitudinally coupled multi-mode piezoelectric filter that uses a longitudinal mode utilizing piezoelectric stiffened effect, but is different from that of the first preferred embodiment in that three modes are used for the different order modes.

The piezoelectric filter 41 includes a piezoelectric element 42 preferably in the form of a substantially rectangular bar as in the first preferred embodiment. The piezoelectric filter 41 utilizes 13th, 14th, and 15th harmonics of modes of vibration that propagate in the longitudinal direction of the piezoelectric element 42.

Thus, the piezoelectric element 42 includes 15 piezoelectric layers stacked with a plurality of excitation electrodes 43 to 58 therebetween. Each of the piezoelectric layers and the excitation electrodes 43 to 58 are preferably configured in the same manner as the first preferred embodiment. On the upper surface of the piezoelectric element 42, the input electrode 14 is disposed near a first end surface 42a, and the output electrode 15 is disposed near a second end surface 42b. On the lower surface of the piezoelectric element 42, the ground electrode 16 is provided. The input electrode 14, the output electrode 15, and the ground electrode 16 are also preferably configured in the same manner as in the first preferred embodiment.

In this preferred embodiment, the excitation electrodes 43 to 58 are classified into first, second, and third groups as follows:

First group of the excitation electrodes—excitation electrodes 44, 46, 48, 50, 51, 53, 55, and 57

Second group of the excitation electrodes—excitation electrodes 43, 45, 47, and 49

Third group of the excitation electrodes—excitation electrodes 52, 54, 56, and 58

The excitation electrodes 43 and 58 are arranged so as to cover the end surfaces 42a and 42b of the piezoelectric element 42.

As in the modification shown in FIG. 3, reflection layers 59 and 60 are coupled to the outer ends of the excitation electrodes 43 and 58, i.e., the outer ends of the piezoelectric element 42, respectively. Holding portions 61 and 62 are connected with the outer ends of the reflection layers 59 and 60, respectively. The reflection layers 59 and 60 and the holding portions 61 and 62 are preferably configured in the same manner as the modification shown in FIG. 3. Thus, even if the holding portions 61 and 62 are used to provide the mechanical support, the filter characteristics of the piezoelectric filter 41 are not affected.

Since other configurations of the piezoelectric filter 41 are similar to those of the piezoelectric filter 1 of the first preferred embodiment, descriptions thereof will be omitted.

The piezoelectric element 42 of this preferred embodiment is also polarized in the longitudinal direction. Thus, application of an input voltage between the input electrode 14 and the ground electrode 16 causes the piezoelectric element 42 to be excited. Modes that are excited in this case will be described below with reference to FIGS. 9A to 9D.

Figure 9A:
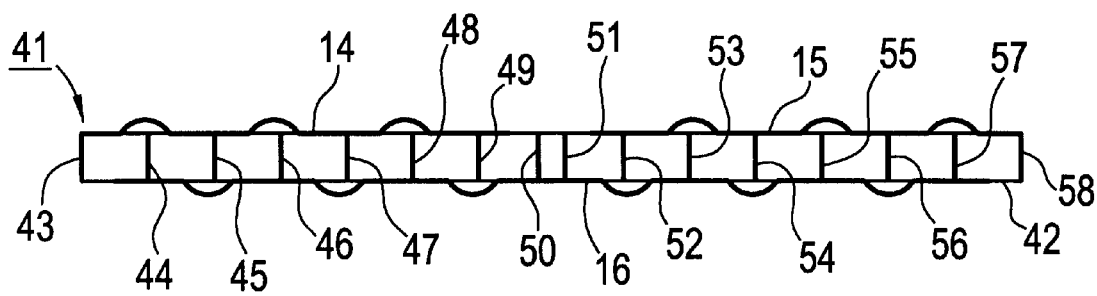
FIG. 9A is a front view schematically illustrating the structure of electrodes of the multi-mode piezoelectric filter according to the second preferred embodiment of the present invention.
Figure 9B:
FIGS. 9B to 9D are schematic diagrams illustrating, respectively, a 14th harmonic, 13th harmonic, and 15th harmonic that are intensely excited in the second preferred embodiment of the present invention.
Figure 9C:
Figure 9D:

FIG. 9A is a schematic view illustrating the structure of electrodes of the piezoelectric filter 41 (the reflection layers and the holding portions are not shown). Application of an input voltage as described above causes intense excitation of a 14th harmonic shown in FIG. 9B, a 13th harmonic shown in FIG. 9C, and a 15th harmonic shown in FIG. 9D. The impedance and filter characteristics of each harmonic in this case will be described below in accordance with a specific experimental example.

As in the first preferred embodiment, the example of the piezoelectric filter 41 was fabricated such that the piezoelectric element 42 had a height of about 100 $\mu$m and a width of about 220 $\mu$m, and such that each piezoelectric layer sandwiched between the adjacent excitation electrodes had a thickness (in the longitudinal direction of the piezoelectric element 42) of about 130 $\mu$m. The piezoelectric element 2 was thus fabricated to have a total thickness of about 1,950 $\mu$m, excluding the thickness of the electrodes. Thereafter, the impedance-frequency characteristic and filter characteristics of this arrangement were measured in the same manner as in the first preferred embodiment.

Figure 12:
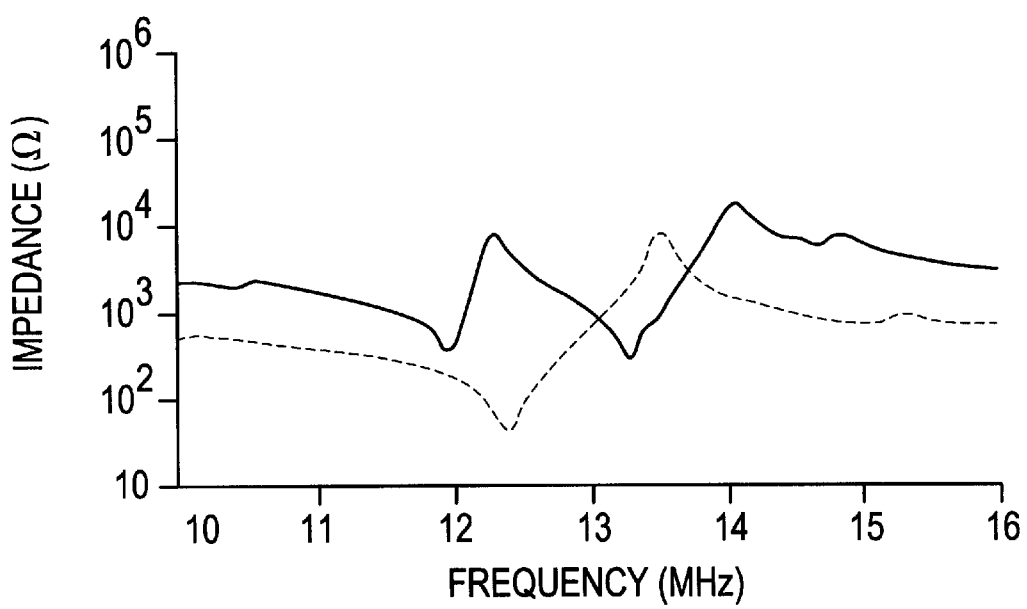
FIG. 12 is a graph showing impedance characteristics of the multi-mode piezoelectric filter of the second preferred embodiment of the present invention.

FIG. 12 shows the impedance characteristic of the piezoelectric filter of this preferred embodiment, with the solid line indicating impedance characteristics including responses of the 13th and 15th harmonics and the broken line indicating characteristics including responses of the 14th harmonic. Thus, these three harmonics are coupled to provide a passband having the resonant frequency of the 13th harmonic and the anti-resonant frequency of the 15th harmonic as attenuation poles.

Figure 13:
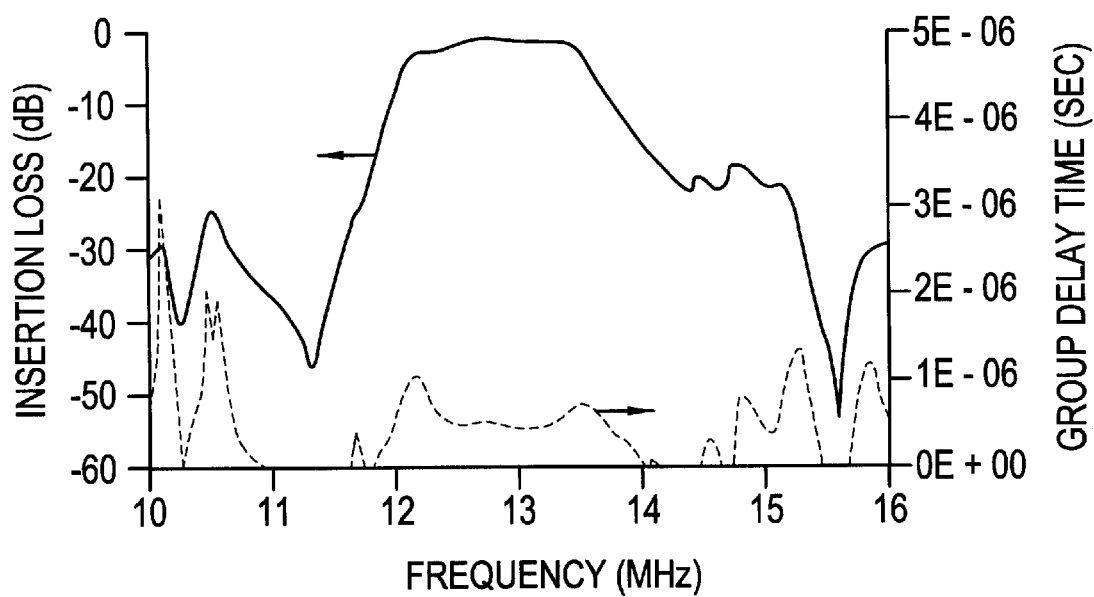
FIG. 13 is a graph showing filter characteristics of the multi-mode piezoelectric filter of the second preferred embodiment of the present invention.

Referring to FIG. 13, the solid line indicates the attenuation-frequency characteristic and the broken line indicates the group delay time characteristic. As shown, this arrangement provides a wider band filter characteristic. In this example, the piezoelectric filter 41 provides a center frequency of about 12.8 MHz and a bandwidth of about 1.5 MHz.

In this preferred embodiment, three harmonics are coupled as described above, thereby producing a band that is even wider than the piezoelectric filter 1 of the first preferred embodiment. In this preferred embodiment, again, the use of different types of harmonics facilitates producing piezoelectric filters having various bandwidths.

As can be appreciated from this preferred embodiment, the longitudinally coupled multi-mode piezoelectric filter according to the present invention utilizes three harmonics. However, four or more harmonics may be efficiently excited by adjusting the positions of excitation electrodes that are arranged within the piezoelectric element, so as to provide a multi-mode piezoelectric filter that utilizes the coupling of four or more harmonics.

In this preferred embodiment, the thicknesses of piezoelectric layers between the adjacent excitation electrodes do not necessarily have to be equal. Thus, the thickness of some of piezoelectric layers may be varied such that the excitation efficiencies of harmonics utilized in the filter are enhanced or the excitation efficiency of a spurious harmonic is decreased.

In this preferred embodiment, excitation electrodes 50 and 51 are connected to the ground electrode 16 and are provided between two closest excitation electrodes that are respectively connected to the input electrode 14 and the output electrode 15. Thus, as in the first preferred embodiment, C1-O is greatly reduced, thereby producing greatly increased attenuation.

In this preferred embodiment, a pair of the piezoelectric filters 41 may also be interconnected with an insulating adhesive or other suitable material to provide a two-element type piezoelectric filter. An example of a filter characteristic of such a two-element type piezoelectric filter is shown in FIG. 14.

Figure 14:
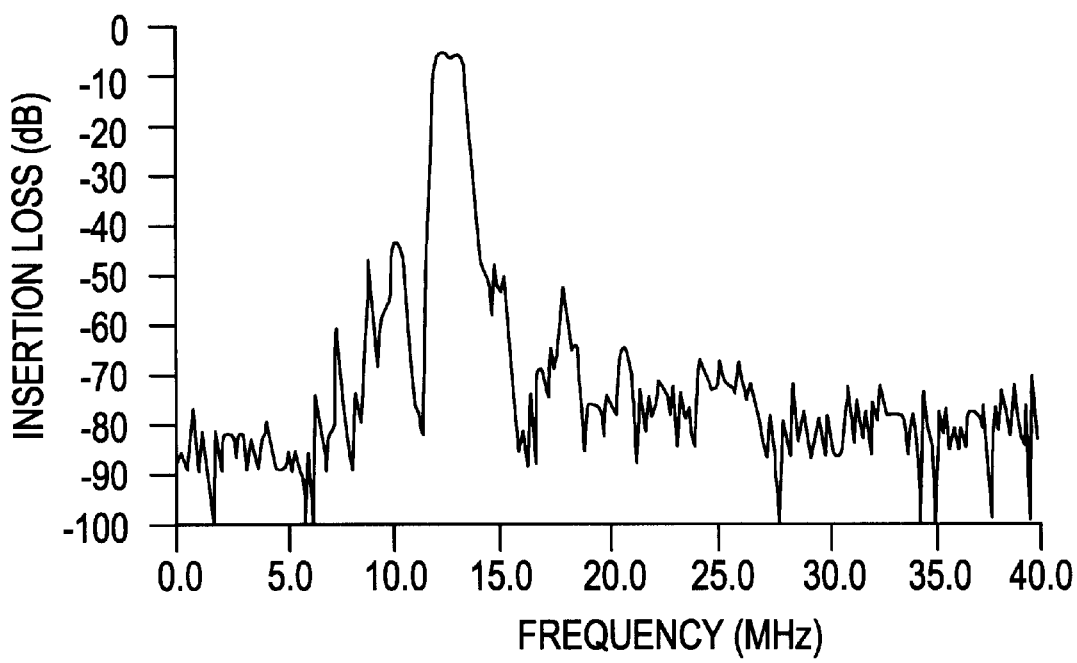
FIG. 14 is a graph showing a filter characteristic of a structure in which a pair of the multi-mode piezoelectric filters according to the second preferred embodiment of the present invention is interconnected.

As shown in FIG. 14, by interconnecting two piezoelectric filters 41, a filter characteristic that is superior in selectivity is produced.

A piezoelectric filter device using a pair of the piezoelectric filters 41 will be described, by way of example, with reference to FIG. 10.

Figure 10:
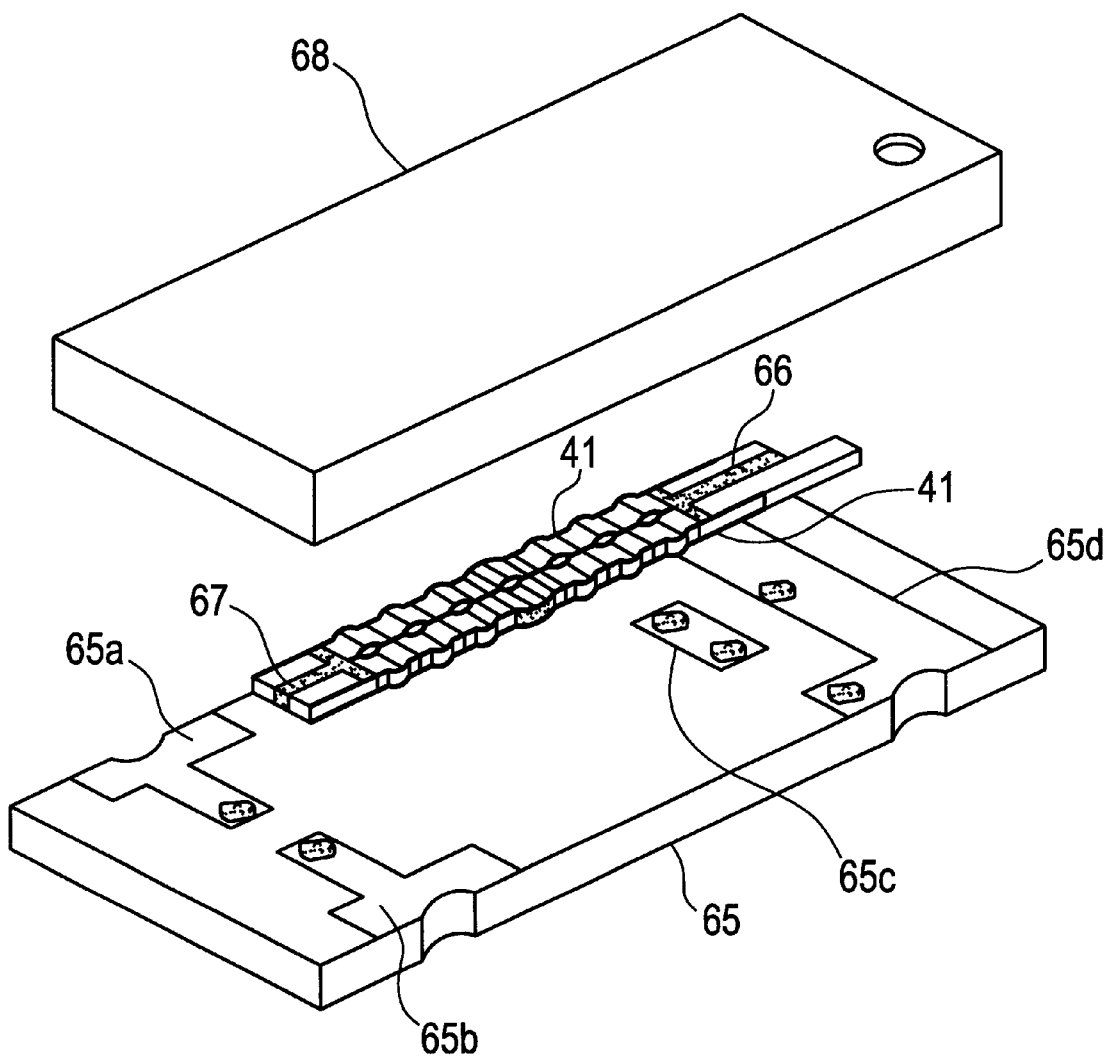
FIG. 10 is an assembly view illustrating a filter device that uses the multi-mode piezoelectric filter of the second preferred embodiment of the present invention.

In the piezoelectric filter device shown in FIG. 10, a pair of the piezoelectric filters 41 is interconnected with insulating adhesives 66 and 67 and is mounted on a casing substrate 65. A metal cap 68 is then fixed to the casing substrate 65 by an insulating adhesive so as to cover the piezoelectric filters 41. This provides a piezoelectric filter device having the pair of piezoelectric filters 41 encapsulated therein. Electrodes 65a to 65d are provided on the casing substrate 65 to provide electrical connection between both of the piezoelectric filters 41 and to define terminal electrodes extending from the casing.

Figure 11:
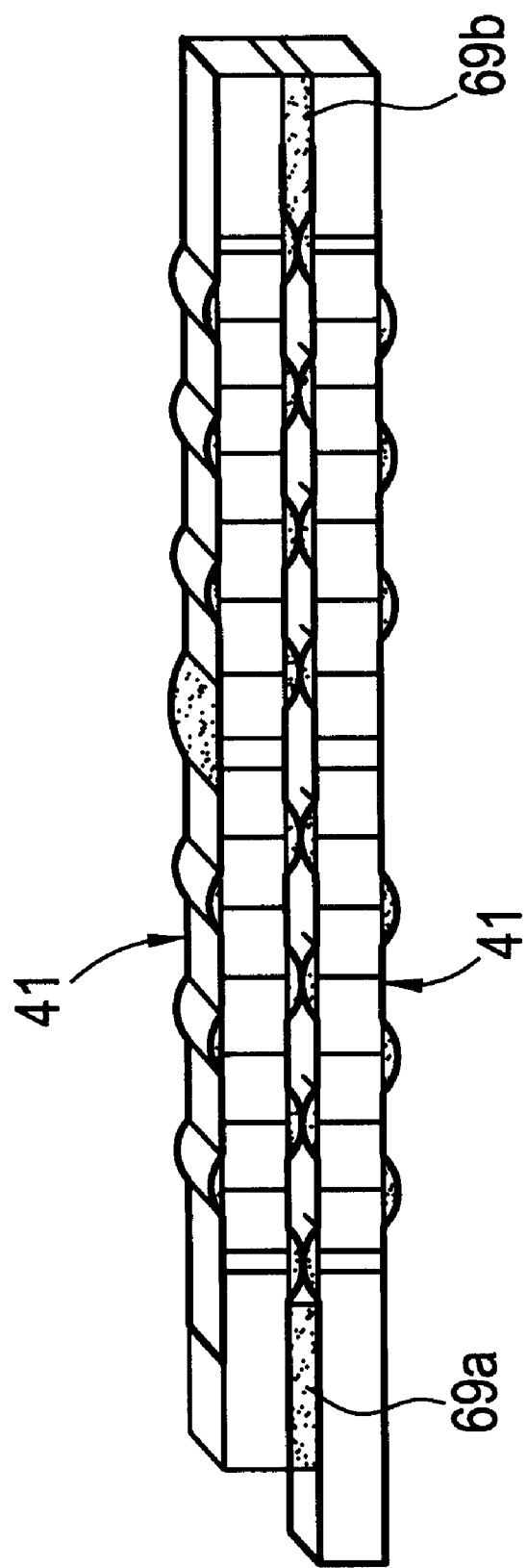
FIG. 11 is a perspective view illustrating the structure in which the multi-mode piezoelectric filters of the second preferred embodiment are stacked in the vertical direction.

In the example shown in FIG. 10, while the pair of piezoelectric filters 41 is interconnected in the horizontal direction, the pair of piezoelectric filters 41 may also be connected in the vertical direction, as shown in FIG. 11, via insulating adhesives 69a and 69b.

Figure 15:
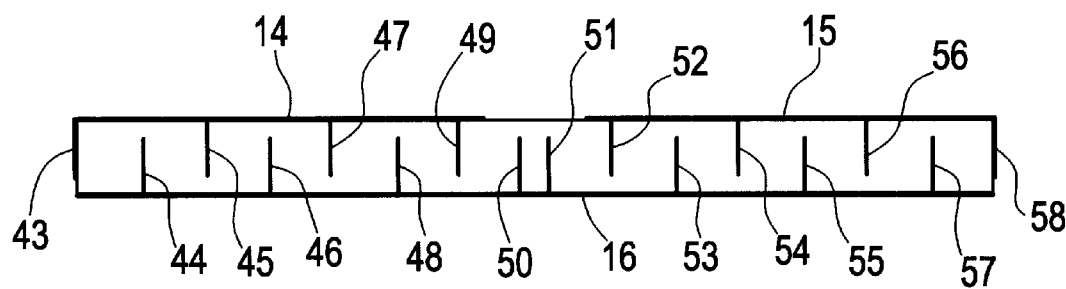
FIG. 15 is a front view schematically illustrating a modification of the multi-mode piezoelectric filter of the second preferred embodiment of the present invention.

FIG. 15 is a front view schematically illustrating a modification of the piezoelectric filter 41. In the piezoelectric filter 41, the insulating materials 18 and 19 provide electrical isolation between the excitation electrodes and the electrodes that must be insulated from the excitation electrodes. However, as in the modification of the first preferred embodiment shown in FIG. 7, the piezoelectric filter 41 may include excitation electrodes that are arranged so as not to extend to either the upper surface or lower surface of the piezoelectric element 42, for providing electric isolation between the excitation electrodes and the electrodes that must be electrically isolated from the excitation electrodes.

The multi-mode piezoelectric filters of the first and second preferred embodiments are configured to utilize harmonics of longitudinal modes of the piezoelectric elements 2 and 42; however, the multi-mode piezoelectric filters according to the present invention are not limited utilizing only a longitudinal mode.

With reference to FIGS. 16 to 18, a longitudinally coupled multi-mode piezoelectric filter, according to the present invention, that utilizes another vibration mode will be described.

Figure 16B:
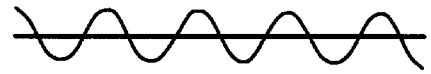
FIGS. 16B and 16C are graphs schematically showing, respectively, a tenth harmonic and a ninth harmonic that are intensely excited in the third preferred embodiment of the present invention.
Figure 16C:
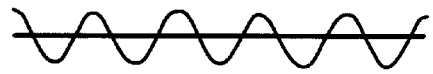
Figure 16A:
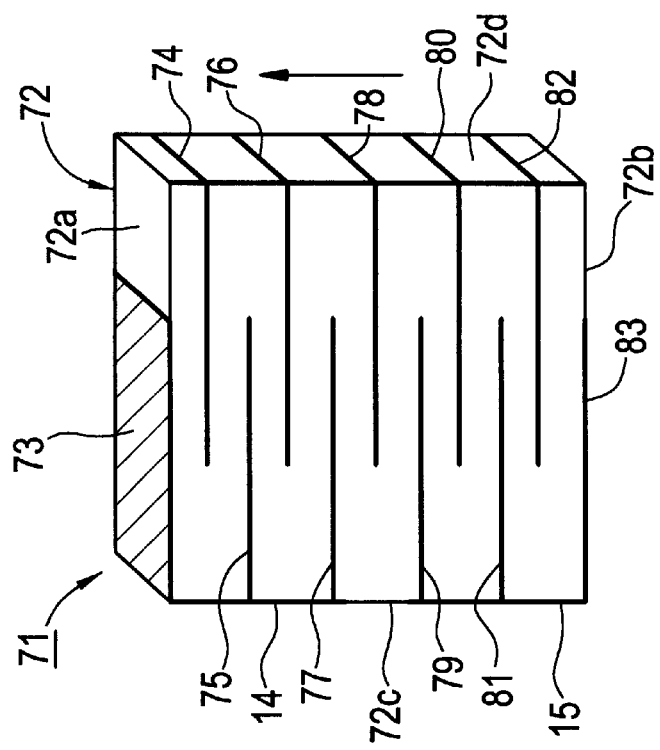
FIG. 16A is a perspective view schematically illustrating a multi-mode piezoelectric filter, according to a third preferred embodiment of the present invention, that uses a thickness extensional mode.

FIG. 16A is a perspective view illustrating the structure of a multi-mode piezoelectric filter according to a third preferred embodiment of the present invention. FIGS. 16B and 16C are schematic diagrams showing harmonics that are excited in the multi-mode piezoelectric filter.

In a piezoelectric filter 71, a plurality of excitation electrodes 73 to 83 is stacked with piezoelectric layers to define a multilayer piezoelectric element 72. With respect to piezoelectric material that defines the piezoelectric layers, as in the first preferred embodiment, an appropriate piezoelectric ceramic such as lead zirconate titanate ceramic is preferably used.

It is to be noted that, in the piezoelectric filter 71, the direction in which the excitation electrodes are stacked, i.e., the vertical direction in FIG. 16A is the thickness direction. An excitation electrode 73 is provided at an upper surface 72a of the multilayer piezoelectric element 72, and an excitation electrode 83 is provided at a lower surface 72b. Other excitation electrodes 74 to 82 are provided in the form of internal electrodes.

In this preferred embodiment, the upper surface 72a and the lower surface 72b oppose each other in the direction that is substantially perpendicular to the excitation electrodes 73 to 83, and define first and second end surfaces of the present invention.

On a side surface 72c of the multilayer piezoelectric element 72, the input electrode 14 is disposed near the upper surface 72a that defines the first end surface, and the output electrode 15 is disposed near the lower surface 72b that defines the second end surface. A ground electrode (not shown) is also provided on a side surface 72d opposing the side surface 72c.

The excitation electrodes 73 to 83 are classified into the above-described first, second, and third groups as follows:

First group of the excitation electrodes—excitation electrodes 74, 76, 78, 80, and 82

Second group of the excitation electrodes—excitation electrodes 73, 75, and 77

Third group of the excitation electrodes—excitation electrodes 79, 81, and 83

In this preferred embodiment, application of an input signal between the input electrode 14 and the ground electrode causes intense excitation of a tenth harmonic, schematically shown in FIG. 16B, of thickness extensional vibration and a ninth harmonic, schematically shown in FIG. 16C, of thickness extensional vibration.

Thus, the tenth harmonic and the ninth harmonic are coupled to provide a passband having a greatly increased bandwidth. This preferred embodiment, therefore, provides a longitudinally coupled dual-mode piezoelectric filter that utilizes a piezoelectric stiffened effect and the ninth and tenth harmonics of thickness extensional vibration. Although, this piezoelectric filter utilizes a different mode of vibration, it provides a greatly increased bandwidth by coupling different order harmonics in the same manner as the first and second preferred embodiments. Furthermore, in this preferred embodiment again, the use of different harmonics enables a desired bandwidth to be produced. Thus, adjusting the number of the piezoelectric layers to be stacked allows efficient excitation of harmonics utilized in the filter, thereby enabling a variety of bandwidths to be achieved for the piezoelectric filter.

In addition, varying the thickness of some of the piezoelectric layers greatly enhances the excitation efficiencies of harmonics utilized in the filter or greatly decreases the excitation efficiencies of spurious harmonics, thus producing a filter having a favorable filter characteristic.

Figure 17C:
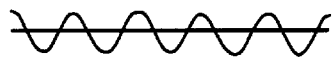
FIGS. 17B and 17C are schematic diagrams illustrating a tenth harmonic and a ninth harmonic that are intensely excited in the multi-mode piezoelectric filter shown in FIG. 17A.
Figure 17B:
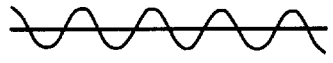
Figure 17A:
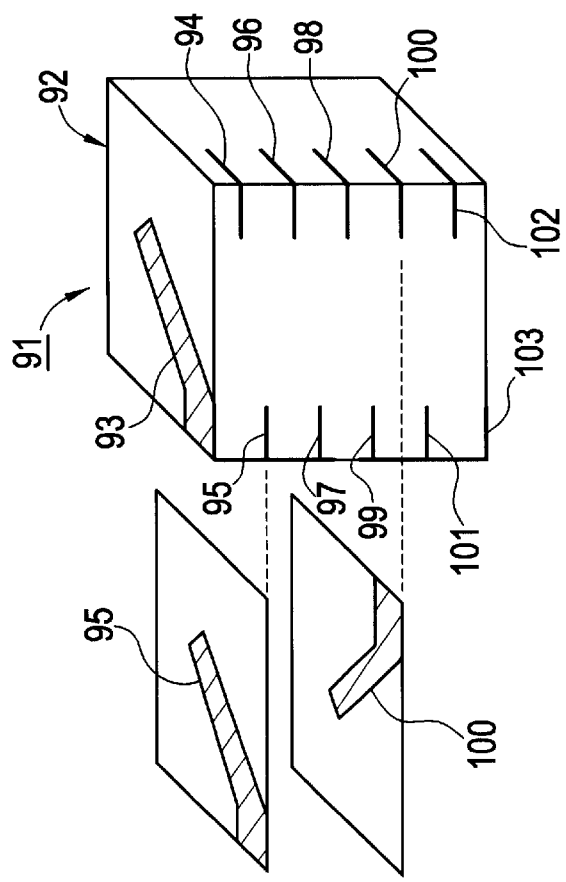
FIG. 17A is a perspective view schematically illustrating a modification of the multi-mode piezoelectric filter of the third preferred embodiment.

FIG. 17A is a perspective view illustrating a piezoelectric filter 91 according to a modification of the piezoelectric filter 71 of the third preferred embodiment. FIGS. 17B and 17C are schematic diagrams showing harmonics that are excited.

In the piezoelectric filter 71 shown in FIG. 16A, the excitation electrodes 73 to 83 oppose each other in a middle area of the multilayer piezoelectric element 72, and each of the piezoelectric layers has a rectangular shape, i.e., strip-like shape. However, various shapes of the piezoelectric layers or excitation electrodes of the present invention can be used. For example, referring to FIG. 17A in which a piezoelectric filter 91 is shown, excitation electrodes 93 to 103, as clearly shown by excitation electrodes 95 and 100, each have the shape of strips extending toward the approximate center at given heights of the multilayer piezoelectric element 92. Portions of the strips of the excitation electrodes 93 to 103 overlap and oppose one another with the piezoelectric layers therebetween. Thus, application of a voltage between the excitation layers, which are vertically stacked, causes each piezoelectric layer to be excited by an energy-trap type thickness extensional mode of vibration. In this manner, excitation electrodes of both sides may oppose one another in portions of each of the piezoelectric layers, such that an energy-trap type piezoelectric filter is achieved.

The piezoelectric filter 91 according to this modification is preferably configured in the same manner as the piezoelectric filter 71, except for excitation electrodes having different shapes. As shown in FIGS. 17B and 17C, the piezoelectric filter 91 also produces efficient excitation of a tenth harmonic and a ninth harmonic, thus producing a wider band filter characteristic as in the piezoelectric filter 71. In the piezoelectric filter 91, the excitation electrodes 93 to 103 oppose one another at given heights in the approximate middle area only, and narrow width portions extend to corner portions of the multilayer piezoelectric element 92. Thus, the excitation electrodes and, especially, piezoelectric layers provided on both sides of internal excitation electrodes 94 to 102 are rigidly fixed. This enhances the strength of the multilayer piezoelectric element 92, thus making this arrangement suitable for a higher frequency.

As compared to each piezoelectric filter of the first to third preferred embodiments, the piezoelectric filter 91, due to an energy trap function achieved thereby, facilitates various changes in the shape of the terminal portions for the excitation electrodes 93 to 103. This also improves the design versatility of the terminal portions for the excitation electrodes 93 to 103.

Figure 18B:
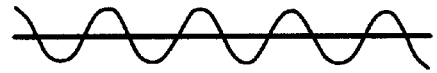
FIGS. 18B and 18C are schematic diagrams illustrating, respectively, a tenth harmonic and a ninth harmonic that are excited in the multi-mode piezoelectric filter shown in FIG. 18A.
Figure 18C:
Figure 18A:
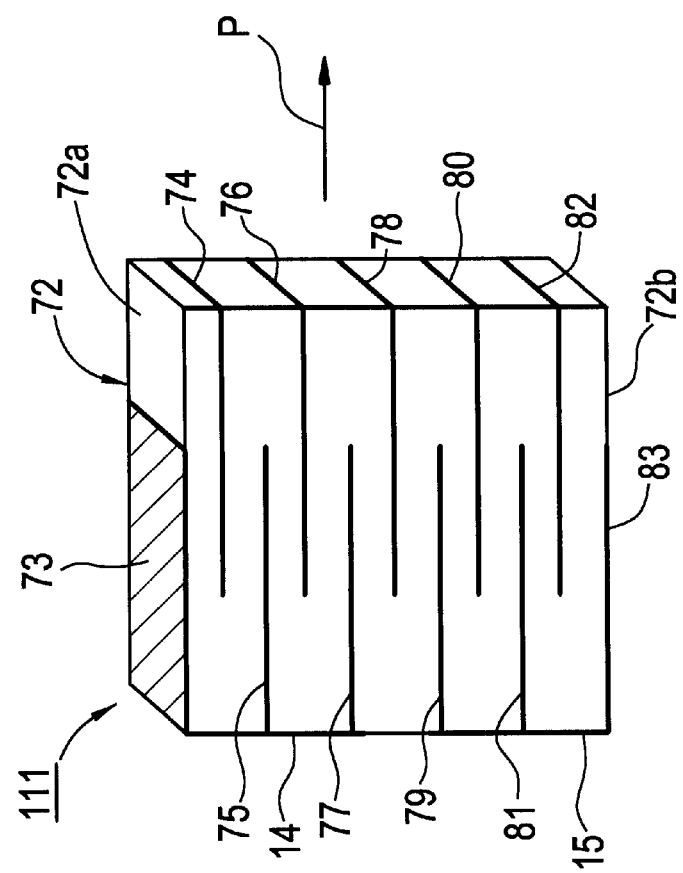
FIG. 18A is a perspective view schematically illustrating a preferred embodiment of a multi-mode piezoelectric filter, according to the present invention, that utilizes a thickness shear mode.

FIG. 18A is a perspective view schematically illustrating a longitudinally coupled dual-mode piezoelectric filter, according to preferred embodiments of the present invention, that utilizes a thickness shear mode. FIGS. 18B and 18C are schematic diagrams illustrating, respectively, a tenth harmonic and a ninth harmonic that are excited in the piezoelectric filter.

A piezoelectric filter 111 has the multilayer piezoelectric element 72 and the excitation electrodes 73 to 83 as in the piezoelectric filter 71. In this preferred embodiment, however, the multilayer piezoelectric element 72 is polarized in the direction P that is substantially parallel to the upper surface 72a and the lower surface 72b, which define the first and the second end surfaces, respectively. Thus, application of an input signal between the input electrode 14 and a ground electrode (not shown) causes excitation of the piezoelectric layers sandwiched by adjacent excitation electrodes, thereby causing intense excitation of vibration of the thickness shear mode. The piezoelectric filter 111 of this preferred embodiment also includes the multilayer piezoelectric element 72 and the stacked excitation electrodes 73 to 83. That is, the piezoelectric filter 111 has a stack of ten piezoelectric layers, thus causing intense excitation of the tenth harmonic shown in FIG. 18B and the ninth harmonic shown in FIG. 18C.

Accordingly, the piezoelectric filter 111 provides a wider band filter characteristic by utilizing the tenth and ninth harmonics of the thickness shear mode.

In this preferred embodiment, the excitation electrodes 73 to 83 overlap in the approximate center of the multilayer piezoelectric element, in the same manner as in the piezoelectric filter 71, thus enhancing the coupling strength of the piezoelectric layers at both sides of the excitation electrodes.

In addition, a thickness shear vibration provides a greatly improved electromechanical coupling coefficient than a thickness extensional vibration, allowing for an even wider bandwidth.

In the piezoelectric filters 71, 91, and 111 shown in FIGS. 16 to 18, three types of harmonics may be used to provide a triple-mode piezoelectric filter, and also four or more modes of vibration may be utilized.

As is appreciated from the first to third preferred embodiments and their modifications, mode of vibration utilized in the present invention is not limited to a particular mode.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A longitudinally coupled multi-mode piezoelectric filter utilizing a piezoelectric stiffened effect, comprising:
    a multilayer piezoelectric element, the multilayer piezoelectric element including:
        at least four excitation electrodes arranged substantially parallel to one another, and
        a plurality of piezoelectric layers each provided between adjacent ones of said at least four excitation electrodes and polarized in a direction that is substantially perpendicular to or substantially parallel to the excitation electrodes, wherein the multilayer piezoelectric element has first and second end surfaces opposing each other in the direction that is substantially perpendicular to the excitation electrodes;
    a ground electrode provided on an outer surface of the multilayer piezoelectric element and electrically connected to a first group defined by at least two of the at least four excitation electrodes, the at least two of the excitation electrodes of the first group being selectively arranged in the direction in which the piezoelectric layers are provided;

an input electrode provided on the outer surface of the multilayer piezoelectric element and electrically connected to a second group defined by at least one of the at least four excitation electrodes, the at least one of the excitation electrodes of the second group being arranged toward the first end surface and being other than the excitation electrodes of the first group; and an output electrode provided on the outer surface of the multilayer piezoelectric element and electrically connected to a third group defined by at least one of the excitation electrodes, the at least one of the excitation electrodes of the third group being arranged toward the second end surface and being other than the excitation electrodes of the first group;

wherein an input signal applied between the input electrode and the ground electrode causes vibration of different order modes to be excited and coupled, such that an output signal is extracted between the output electrode and the ground electrode.

2. A longitudinally coupled multi-mode piezoelectric filter according to claim 1, wherein the different order modes are an nth harmonic and an (n−1)th harmonic, n being an integer equal to or greater than 3.

3. A longitudinally coupled multi-mode piezoelectric filter according to claim 1, wherein the different order modes are an nth harmonic, an (n−1)th harmonic, and an (n+1)th harmonic, n being an integer equal to or greater than 3.

4. A longitudinally coupled multi-mode piezoelectric filter according to claim 1, wherein at least one of the first group of the excitation electrodes is arranged between two closest excitation electrodes, one of which belonging to the second group and the other belonging to the third group.

5. A longitudinally coupled multi-mode piezoelectric filter according to claim 1, further comprising:

reflection layers respectively coupled to the first and second end surfaces of the multilayer piezoelectric element and made of material having a second acoustic impedance $Z_2$ that is smaller than an acoustic impedance $Z_1$ of piezoelectric material that defines the piezoelectric layers of the multilayer piezoelectric element; and holding portions respectively coupled to outer surfaces of the reflection layers and made of material having a third acoustic impedance $Z_3$ that is greater than the second acoustic impedance $Z_2$, the outer surfaces of the reflection layers opposing the first and second end surfaces to which the reflection layers are coupled.

6. A longitudinally coupled multi-mode piezoelectric filter which utilizes a piezoelectric stiffened effect, comprising:

a multilayer piezoelectric element, the multilayer piezoelectric element including:

at least four excitation electrodes arranged substantially parallel to one another, and a plurality of piezoelectric layers each provided between adjacent ones of said at least four excitation electrodes and polarized in a direction that is substantially perpendicular to the excitation electrodes, wherein the multilayer piezoelectric element has first and second end surfaces opposing each other in the direction that is substantially perpendicular to the excitation electrodes, and has first, second, third, and fourth side surfaces extending between the first and second end surfaces in a longitudinal direction of the piezoelectric element;

a ground electrode provided on an outer surface of the multilayer piezoelectric element and electrically connected to a first group defined by at least two of the at least four excitation electrodes, the at least two of the at least four excitation electrodes of the first group being selectively arranged in the direction in which the piezoelectric layers are provided;

an input electrode provided on the outer surface of the multilayer piezoelectric element and electrically connected to a second group defined by at least one of the at least four excitation electrodes, the at least one of the excitation electrodes of the second group being arranged toward the first end surface and being other than the excitation electrodes of the first group; and an output electrode provided on the outer surface of the multilayer piezoelectric element and electrically connected to a third group defined by at least one of the excitation electrodes, the at least one of the excitation electrodes of the third group being arranged toward the second end surface and being other than the excitation electrodes of the first group;

wherein an input signal applied between the input electrode and the ground electrode causes excitation and coupling of vibration of different order length modes, such that an output signal is extracted between the output electrode and the ground electrode.

7. A longitudinally coupled multi-mode piezoelectric filter according to claim 6, wherein the different order modes are an nth harmonic and an (n−1)th harmonic, n being an integer equal to or greater than 3.

8. A longitudinally coupled multi-mode piezoelectric filter according to claim 6, wherein the different order modes are an nth harmonic, an (n−1)th harmonic, and an (n+1)th harmonic, n being an integer equal to or greater than 3.

9. A longitudinally coupled multi-mode piezoelectric filter according to claim 6, wherein at least one of the first group of the excitation electrodes is arranged between two closest excitation electrodes, one of which belonging to the second group and the other belonging to the third group.

10. A longitudinally coupled multi-mode piezoelectric filter according to claim 1, further comprising:

reflection layers respectively coupled to the first and second end surfaces of the multilayer piezoelectric element and made of material having a second acoustic impedance $Z_2$ that is smaller than an acoustic impedance $Z_1$ of piezoelectric material that defines the piezoelectric layers of the multilayer piezoelectric element; and holding portions respectively coupled to outer surfaces of the reflection layers and made of material having a third acoustic impedance $Z_3$ that is greater than the second acoustic impedance $Z_2$, the outer surfaces of the reflection layers opposing the first and second end surfaces to which the reflection layers are coupled.

11. A longitudinally coupled multi-mode piezoelectric filter which utilizes a piezoelectric stiffened effect, comprising:

a multilayer piezoelectric element, the multilayer piezoelectric element including:

at least four excitation electrodes arranged substantially parallel to one another, and a plurality of piezoelectric layers each provided between two adjacent excitation electrodes and polarized in a direction that is substantially perpendicular to the excitation electrodes, wherein the multilayer piezoelectric element has first and second end surfaces opposing each other in a direction that is substantially perpendicular to the excitation electrodes, and has first, second, third, and fourth side surfaces extending between the first and second end surfaces extending in a thickness direction of the piezoelectric element;

a ground electrode provided on an outer surface of the multilayer piezoelectric element and electrically connected to a first group defined by at least two of the at least four excitation electrodes, the at least two of the excitation electrodes of the first group being selectively arranged in the direction in which the piezoelectric layers are provided;

an input electrode provided on the outer surface of the multilayer piezoelectric element and electrically connected to a second group defined by at least one of the at least four excitation electrodes, the at least one of the excitation electrodes of the second group being arranged toward the first end surface and being other than the excitation electrodes of the first group; and an output electrode provided on the outer surface of the multilayer piezoelectric element and electrically connected to a third group defined by at least one of the at least four excitation electrodes, the at least one of the excitation electrodes of the third group being arranged toward the second end surface and being other than the excitation electrodes of the first group;

whereby an input signal applied between the input electrode and the ground electrode causes excitation and coupling of vibration of different order thickness extensional modes, such that an output signal is extracted between the output electrode and the ground electrode.

12. A longitudinally coupled multi-mode piezoelectric filter according to claim 11, wherein the different order modes are an nth harmonic and an (n−1)th harmonic, n being an integer equal to or greater than 3.

13. A longitudinally coupled multi-mode piezoelectric filter according to claim 11, wherein the different order modes are an nth harmonic, an (n−1)th harmonic, and an (n+1)th harmonic, n being an integer equal to or greater than 3.

14. A longitudinally coupled multi-mode piezoelectric filter according to claim 11, wherein at least one of the first group of the excitation electrodes is arranged between two closest excitation electrodes, one of which belonging to the second group and the other belonging to the third group.

15. A longitudinally coupled multi-mode piezoelectric filter according to claim 11, further comprising:

reflection layers respectively coupled to the first and second end surfaces of the multilayer piezoelectric element and made of material having a second acoustic impedance $Z_2$ that is smaller than an acoustic impedance $Z_1$ of piezoelectric material that defines the piezoelectric layers of the multilayer piezoelectric element; and holding portions respectively coupled to outer surfaces of the reflection layers and made of material having a third acoustic impedance $Z_3$ that is greater than the second acoustic impedance $Z_2$, the outer surfaces of the reflection layers opposing the first and second end surfaces to which the reflection layers are coupled.

16. A longitudinally coupled multi-mode piezoelectric filter, comprising:

a multilayer piezoelectric element, the multilayer piezoelectric element including:

at least four excitation electrodes arranged substantially parallel to one another, and a plurality of piezoelectric layers each provided between adjacent ones of the at least four excitation electrodes and polarized in a direction that is substantially parallel to the excitation electrodes, wherein the multilayer piezoelectric element has first and second end surfaces opposing each other in a direction that is substantially perpendicular to the excitation electrodes, and has first, second, third, and fourth side surfaces extending between the first and second end surfaces in a thickness direction of the piezoelectric element;

a ground electrode provided on an outer surface of the multilayer piezoelectric element and electrically connected to a first group defined by at least two of the at least four excitation electrodes, the at least two of the excitation electrodes of the first group being selectively arranged in the direction in which the piezoelectric layers are provided;

an input electrode provided on the outer surface of the multilayer piezoelectric element and electrically connected to a second group defined by at least one of the at least four excitation electrodes, the at least one of the excitation electrodes of the second group being arranged toward the first end surface and being other than the excitation electrodes of the first group; and an output electrode provided on the outer surface of the multilayer piezoelectric element and electrically connected to a third group defined by at least one of the at least four excitation electrodes, the at least one of the excitation electrodes of the third group being arranged toward the second end surface and being other than the excitation electrodes of the first group;

wherein an input signal applied between the input electrode and the ground electrode causes excitation and coupling of vibration of different order thickness shear modes, such that an output signal is extracted between the output electrode and the ground electrode.

17. A longitudinally coupled multi-mode piezoelectric filter according to claims 16, wherein the different order modes are an nth harmonic and an (n−1)th harmonic, n being an integer equal to or greater than 3.

18. A longitudinally coupled multi-mode piezoelectric filter according to claim 16, wherein the different order modes are an nth harmonic, an (n−1)th harmonic, and an (n+1)th harmonic, n being an integer equal to or greater than 3.

19. A longitudinally coupled multi-mode piezoelectric filter according to claim 16, wherein at least one of the first group of the excitation electrodes is arranged between two closest excitation electrodes, one of which belonging to the second group and the other belonging to the third group.

20. A longitudinally coupled multi-mode piezoelectric filter according to claim 16, further comprising:

reflection layers respectively coupled to the first and second end surfaces of the multilayer piezoelectric element and made of material having a second acoustic impedance $Z_2$ that is smaller than an acoustic impedance $Z_1$ of piezoelectric material that defines the piezoelectric layers of the multilayer piezoelectric element; and holding portions respectively coupled to outer surfaces of the reflection layers and made of material having a third acoustic impedance $Z_3$ that is greater than the second acoustic impedance $Z_2$, the outer surfaces of the reflection layers opposing the first and second end surfaces to which the reflection layers are coupled.

* * * * *